United States Patent [19]

Meyer

[11] Patent Number: 5,581,565

[45] Date of Patent: Dec. 3, 1996

[54] MEASURING APPARATUS USED FOR TESTING CONNECTIONS BETWEEN AT LEAST TWO SUBASSEMBLIES

[75] Inventor: Gerhard Meyer, Erlangen, Germany

[73] Assignee: U.S. Philips Corporation, New York, N.Y.

[21] Appl. No.: 349,094

[22] Filed: Dec. 1, 1994

[30]     Foreign Application Priority Data

Dec. 1, 1993 [DE] Germany ............................ 43 40 899.0

[51] Int. Cl.$^6$ ..................................................... G06F 11/00
[52] U.S. Cl. ....................................... 371/22.3; 395/183.06
[58] Field of Search .................................. 371/22.6, 22.1, 371/22.3, 25.1; 324/158.1, 158 R; 395/183.06

[56]                    References Cited

U.S. PATENT DOCUMENTS

| 5,029,166 | 7/1991 | Jarwala et al. | 371/22.1 |
|---|---|---|---|
| 5,109,190 | 4/1992 | Sakashita et al. | 324/158 R |
| 5,155,432 | 10/1992 | Mahoney | 324/158 R |

*Primary Examiner*—V. Canney
*Attorney, Agent, or Firm*—Laurie E. Gathman

[57]                        ABSTRACT

The invention relates to a measuring apparatus used for testing the connections between at least two subassemblies (3, 4, 5), comprising a test system (1) for generating a test signal available on an output of the test system and for evaluating an analysis signal produced by a subassembly (3, 4, 5) from the test signal and received on an input of the test system. The test system (1) is also provided for applying a switch control signal to a controller (10, 11, 12) included in a subassembly (3, 4, 5). A subassembly (3, 4, 5) includes a switching circuit (7, 8, 9) controlled by the assigned controller (10, 11, 12), which switching circuit is provided for directing a test signal or an intermediate signal formed from this test signal to a test input of a subassembly and for receiving at least a further intermediate signal from a test output of a subassembly. A switching circuit (7, 8, 9) in a first position is provided for coupling the test input of the subassembly to the output of the test system and for coupling the test output of the subassembly to an auxiliary line (BR), and in a second position of the switching circuit, for coupling the test input of the subassembly to an auxiliary line (BR) and for coupling the test output of the subassembly to the input of the test system or to a further auxiliary line (BR).

7 Claims, 1 Drawing Sheet

MEASURING APPARATUS USED FOR TESTING CONNECTIONS BETWEEN AT LEAST TWO SUBASSEMBLIES

BACKGROUND OF THE INVENTION

The invention relates to a measuring apparatus used for testing the connections between at least two subassemblies, comprising a test system for generating a test signal available on an output of the test system and for evaluating an analysis signal produced by a subassembly from the test signal and received on an input of the test system.

Such a measuring apparatus is known, for example, from U.S. Pat. No. 5,029,166 which describes a test system for generating a test signal (Test Data Input TDI), a test clock signal (TCK) and a test control signal (Test Mode Signal TMS) and for receiving an analysis signal (Test Data Output TDO). A boundary scan test is made with this measuring apparatus. Boundary scan cells are positioned, for example, before the inputs of circuit arrangements to be tested, which cells receive either direct or derived test signals. In the boundary scan cells test signals can be combined with input signals. The boundary scan cells are serially connected and the last boundary scan cell produces an intermediate signal or an analysis signal. An analysis signal is applied direct to the test system. The intermediate signal is applied to the next boundary scan cell. This measuring apparatus can be used for testing individual circuit arrangements or connections between the circuit arrangements or subassemblies.

The connections of subassemblies can be tested if the individual subassemblies form a ring-like connection for the test or the measurement. A test input of a subassembly is then connected either to an output of a test system or a subassembly test output of another subassembly. If the interconnections of subassemblies in a system are to be tested, all the subassemblies of the system are to be available and operable. When the system is set up or in a modular system (for example, in telecommunications technology), such a ting configuration cannot be used without further measures being taken.

A further possibility is the use of a star configuration to test subassemblies of a system. However, in that configuration each subassembly needs to have its own control line for a test control signal assigned to each subassembly.

SUMMARY OF THE INVENTION

Therefore, it is an object of the invention to provide in modular systems and without much circuitry and cost a measuring apparatus with which the connections between the subassemblies of the system can be tested.

For a measuring apparatus of the type set forth in the opening paragraph this object is achieved in that the test system is also provided for applying a switch control signal to a controller included in a subassembly, in that a subassembly includes a switching circuit controlled by the assigned controller, which switching circuit is provided for directing a test signal or an intermediate signal formed from this test signal to a test input of a subassembly and for receiving at least a further intermediate signal from a test output of a subassembly, and in that a switching circuit in a first position is provided for coupling the test input of the subassembly to the output of the test system and for coupling the test output of the subassembly to an auxiliary line, and in a second position of the switching circuit, for coupling the test input of the subassembly to an auxiliary line and for coupling the test output of the subassembly to the input of the test system or to a further auxiliary line.

The subassemblies to be tested or measured additionally include a switching circuit which has not only a connection to the test system but also an auxiliary line to at least one further subassembly. The switching circuit is controlled by a controller which is already available anyhow in a complex subassembly as used, for example, in telecommunications. The controller is then actuated in response to the switch control signal. A switching circuit couples in a first position a subassembly test input to the output of the test system which generates the test signal, and couples the associated subassembly test output to the auxiliary line. If a switching circuit of a first subassembly is in a first position, a switching circuit of a second subassembly is in a second position. The switching circuit of the second subassembly will then couple its subassembly test input to the auxiliary line or to a further auxiliary line if the connections of an inserted third subassembly are also to be measured, and its subassembly test output to the input of the test system. The switching circuit of the third subassembly realises, on the one hand, a coupling between the first auxiliary line and the associated subassembly test input and, on the other hand, a coupling between the second auxiliary line and the subassembly test output. It would also be possible to include more subassemblies. This would require further auxiliary lines.

With the measuring apparatus according to the invention a test or a measurement of connections between subassemblies is made possible, in which apparatus the connections for the signals are established individually by switching circuits in the subassemblies. In this manner it is also possible to test modular systems without further lines for test control signals being necessary.

If a circuit arrangement of a subassembly is to be tested, the switching circuit changes in a third position. In that position the subassembly test input is coupled to the output of the test system and the subassembly test output is coupled to the input of the test system.

The switching circuit of a subassembly that is not to be tested changes in a fourth position. In the fourth position there is no coupling between the subassembly test input and the output of the test system and between the subassembly test output and the input of the test system.

To generate a test signal and a test clock signal, the test system comprises a test generator and an evaluation circuit. The evaluation circuit produces a test control signal which is to be applied to subassemblies and indicates a test, and evaluates an analysis signal. The test control signal indicates, for example, what type of test is made and how individual switch elements are to carry out the test of a subassembly. Furthermore, the switching circuit of a subassembly, which switching circuit is controlled in response to the switch control signal, is used in the first, second and third switch positions to apply the test clock signal to the circuit arrangements of the subassemblies.

As set forth above, the controllers of a subassembly also cause other control operations to be carried out during normal operation. As such controllers are generally coupled to each other by a bus system, the evaluation circuit can be simply coupled to such a bus. The bus is thus not used solely for transmitting a switch control signal.

A new subassembly can be simply inserted into the system when the test signal, the test clock signal, the test control signal and the intermediate signal are transmitted by lines having a similar structure to a bus.

The invention further relates to a subassembly provided for receiving a test signal to be supplied by a test system via an output of the test system, or an intermediate signal from another subassembly and for applying a further intermediate signal to a further subassembly, or an analysis signal formed from the test signal and to be applied to an input of the test system. In that case a controller is arranged in the subassembly for receiving a switch control signal from the test system. A switching circuit controlled by the assigned controller is also included in the subassembly, which subassembly is provided for directing a test signal or an intermediate signal formed from the test signal to a subassembly test input and for receiving at least a further intermediate signal from a subassembly test output. The switching circuit is provided, in a first position, for coupling the subassembly test input to the output of the test system and for coupling the subassembly test output to an auxiliary line and, in a second position, for coupling the subassembly test input to an auxiliary line and for coupling the subassembly test output to the input of the test system or to a further auxiliary line.

BRIEF DESCRIPTION OF THE DRAWINGS

An embodiment of the invention will be explained in the following with reference to FIG. 1 which shows a measuring apparatus for testing the connections between at least two subassemblies and for testing a circuit arrangement of a subassembly.

DETAILED DESCRIPTION OF THE PREFERRED EMBODIMENTS

Figure 1:
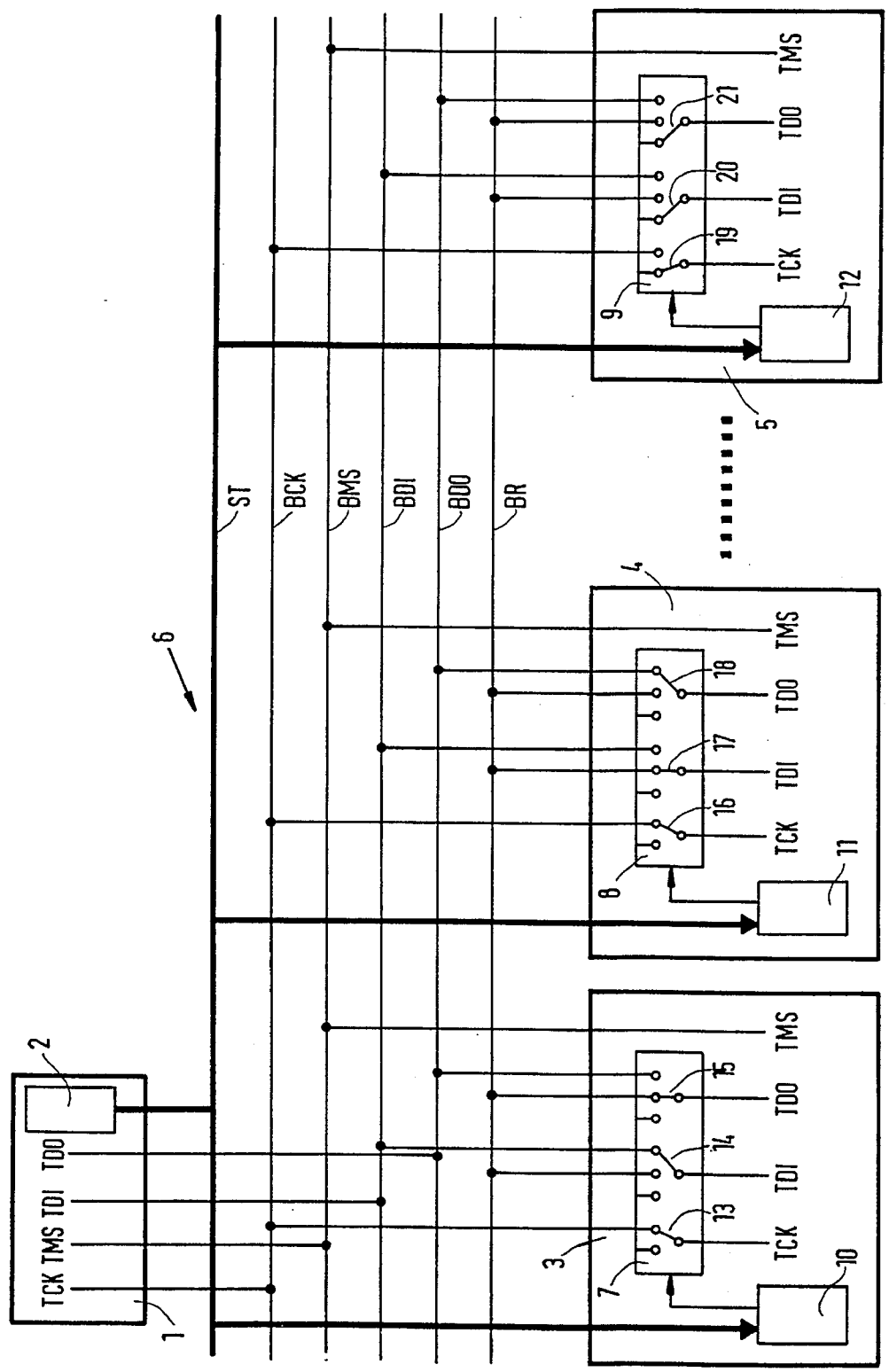

The measuring apparatus shown in FIG. 1 comprises a test system 1 which includes an evaluation circuit 2 which may be arranged, for example, as a microprocessor or signal processor, and a clock generator (not shown). A boundary scan test of subassemblies 3, 4 and 5 can be made with the test system 1. For this purpose, the subassemblies 3, 4 and 5 are supplied with a test clock signal TCK, a test control signal TMS and a test signal TDI by the test system 1. When the test signal, generated for example in test system 1, has passed through one or various subassemblies 3, 4 and 5, an analysis signal TDO is received which is evaluated by the evaluation circuit 2 and indicates whether the system or the subassemblies operate correctly. The test signal TDI may provide a test sequence which is applied direct to the individual boundary scan cells in a subassembly 3, 4 or 5, or to a circuit arrangement in the subassembly 3, 4 or 5, or converted in a converter in a subassembly 3, 4 or 5. The test control signal TMS indicates, for example, the type of test concerned.

The test system 1 can be coupled to the subassemblies 3, 4 and 5 via a bus system 6. Each subassembly 3, 4 and 5 comprises an extra switching circuit 7, 8 and 9 in addition to the circuit arrangements provided for certain functions of the subassembly. This switching circuit is controlled by a controller 10, 11 and 12 which in normal operation performs also different functions on the subassemblies 3, 4 and 5 and is arranged, for example, as a microprocessor or signal processor. The controllers 10, 11 and 12 are coupled to each other and to the evaluation circuit 2 via line ST of the bus system 6. Via the line ST of the bus system 6 the controllers 10, 11 and 12 are supplied with a switch control signal from the evaluation circuit 2.

The bus system 6 further includes a line BCK by which the test clock signal TCK is transmitted. The test control signal TMS is carried over a line BMS of the bus system 6. The test signal TDI is applied to a line BDI and the analysis signal TDO to a line BDO of the bus system 6. In the bus system 6 there is further an auxiliary line BR which makes at least an auxiliary connection possible between two subassemblies.

In the following the function of a switching circuit 7, 8 or 9 is further described with reference to the switching circuit 7. The switching circuit 7 has three separate switches 13, 14 and 15 which convey signals received via the bus system 6 to subassembly 3. The first switch 13 in the switching circuit 7 can establish a connection to the bus line BCK or go to a neutral position. If the switch 13 is not in a neutral position, it conveys the test clock signal TCK to circuit arrangements of the subassembly 3. The second switch 14 in the switching circuit 7 is used for establishing a connection either between the bus line BDI or the auxiliary line BR. This switch 14 can also go to a neutral position in which there is no connection to a bus line. If the switch 14 is not in a neutral position, it applies either a test signal TDI from an output of the test system 1 to a test input of the subassembly 3, or receives a derived test signal from another subassembly 4 or 5 via the auxiliary line BR of the bus system 6. The switch 15 can establish a connection to the bus line BDO and a connection to the auxiliary line BR. Also switch 15 has a neutral position. A test signal which has, for example, passed through circuit arrangements of the subassembly 3 is led to the auxiliary line BR of the bus system 6 via a test output of the subassembly 3, via switch 15, or via the bus line BDO to the input of the test system 1.

The switching circuits 8 and 9 too have each three switches 16, 17 and 18 and 19, 20 and 21, respectively. These switches 16, 17 and 18 and 19, 20 and 21 operate similarly to the switches 13, 14 and 15 of the switching circuit 7.

If one circuit arrangement or various circuit arrangements in a subassembly 3, 4 or 5 are to be measured or tested, the switch 13 directs the clock signal to one or a plurality of circuit arrangements of the subassembly 3, 4 or 5. The switch 14 delivers, for example, a test signal TDI to the test input of subassembly 3 via the bus line BDI. The switch 15 of switching circuit 7 directs the test signal passing through the subassembly 3 to the bus line BDO as an analysis signal. In that case the switching circuit is in a third position. The other switches 16, 17 and 18 and 19, 20 and 21 of the switching circuits 8 and 9 are in a neutral position (fourth position).

When connections between two subassemblies, for example, subassemblies 3 and 4, are tested and measured, subassembly 3 receives the test signal TDI via switch 14. The test signal passing through the subassembly is sent as an intermediate signal to the auxiliary line BR of the bus system 6 via switch 15 of switching circuit 7. Switching circuit 7 is then in a first position. The switch 17 of the switching circuit 8 (subassembly 4) directs the intermediate signal from the auxiliary line BR to the test input of the subassembly 4. This intermediate signal passing through the various circuit arrangements of the subassembly 4 is fed to the bus line BDO as an analysis signal via switch 18 of switching circuit 8 and evaluated upon reception in the test generator 1. Switching circuit 8 is then in a second position. The switches 19, 20 and 21 of the other switching circuit 9 are in a neutral position (fourth position).

The test clock signal TCK is not taken to circuit arrangements of subassemblies 3, 4 and 5 only in the fourth switching position. The test control signal TMS shows a direct connection to circuit arrangements of the subassemblies 3, 4 and 5.

What is claimed is:

1. Measuring apparatus used for testing the connections between at least two subassemblies, comprising a test system (1) for generating a test signal available on an output of the test system and for evaluating an analysis signal produced by a subassembly from the test signal and received on an input of the test system, characterized in that the test system is also provided for applying a switch control signal to a controller included in a subassembly, in that a subassembly includes a switching circuit controlled by the assigned controller, which switching circuit is provided for directing a test signal or an intermediate signal formed from this test signal to a test input of a subassembly and for receiving at least a further intermediate signal from a test output of a subassembly, and in that a switching circuit in a first position is provided for coupling the test input of the subassembly to the output of the test system and for coupling the test output of the subassembly to an auxiliary line (BR), and in a second position of the switching circuit, for coupling the test input of the subassembly to an auxiliary line (BR) and for coupling the test output of the subassembly to the input of the test system or to a further auxiliary line (BR).

2. Measuring apparatus as claimed in claim 1, characterized in that for testing at least one circuit arrangement in a subassembly, the switching circuit in a third position is provided for coupling the test input of the subassembly to the output of the test system and for coupling the test output of the subassembly to the input of the test system.

3. Measuring apparatus as claimed in claim 1, characterized in that there is no coupling between the test input of the subassembly (3, 4, 5) and the output of the test system and between the test output of the subassembly and the input of the test system if the switching circuit (7, 8, 9) of a subassembly not to be tested is in a fourth position.

4. Measuring apparatus as claimed in claim 1, characterized in that the test system includes a test generator for generating a test signal and a test clock signal, in that the test system includes an evaluation circuit for generating a test control signal to be transported to the subassembly and denoting a test operation and for evaluating an analysis signal, and in that the switching circuit of a subassembly which switching circuit is controlled in response to the switch control signal is used in the first, second and third switching positions to apply the test clock signal to the circuit arrangements of the subassemblies.

5. Measuring apparatus as claimed in claim 1, characterized in that the controller in a subassembly is not only provided for controlling the assigned switching circuit and in that the controllers of the subassemblies and the evaluation circuit (2) are coupled to each other via bus lines which are not used solely for transmitting a switch control signal.

6. Measuring apparatus as claimed in claim 1, characterized in that the test signal, the test clock signal, the test control signal and the intermediate signal are transmitted by lines having a similar structure to a bus.

7. Subassembly arranged for receiving a test signal to be supplied by a test system via an output of the test system, or an intermediate signal from another subassembly and for applying a further intermediate signal to a further subassembly or supplying an analysis signal formed from the test signal and to be applied to an input of a test system, characterized in that a control arrangement is arranged for receiving a switch control signal from the test system, in that a switching circuit controlled by the assigned controller is arranged which switching circuit is provided for directing a test signal or an intermediate signal derived from the test signal to a test input of a subassembly and for receiving at least a further intermediate signal from a test output of a subassembly, and in that the switching circuit in a first position is arranged for coupling the test input of the subassembly to the output of the test system and for coupling the test output of the subassembly to an auxiliary line (BR) and, in a second position, for coupling the test input of the subassembly to an auxiliary line (BR) and for coupling the test output of the subassembly to the input of the test system or to a further auxiliary line (BR).

* * * * *